US005753950A

United States Patent [19]
Kojima

[11] Patent Number: 5,753,950
[45] Date of Patent: May 19, 1998

[54] NON-VOLATILE MEMORY HAVING A CELL APPLYING TO MULTI-BIT DATA BY DOUBLE LAYERED FLOATING GATE ARCHITECTURE AND PROGRAMMING/ERASING/READING METHOD FOR THE SAME

[75] Inventor: Toshiaki Kojima, Sendai, Japan

[73] Assignee: Motorola, Inc., Schaumburg, Ill.

[21] Appl. No.: 630,184

[22] Filed: Apr. 10, 1996

[30] Foreign Application Priority Data

May 19, 1995 [JP] Japan .................... 7-121142

[51] Int. Cl.$^6$ .................... H01L 29/788; G11C 11/34
[52] U.S. Cl. .................... 257/315; 257/316; 365/185.01; 365/185.03; 365/185.1
[58] Field of Search .................... 257/315–330; 365/185.01, 185.3, 185.1

[56] References Cited

U.S. PATENT DOCUMENTS

| | | | |
|---|---|---|---|
| 5,021,999 | 6/1991 | Kohda et al. | 365/185.1 |
| 5,622,881 | 4/1997 | Acocella et al. | 365/185.1 |
| 5,633,520 | 5/1997 | Wu et al. | 257/316 |

FOREIGN PATENT DOCUMENTS

| | | |
|---|---|---|
| 3-6679 (A) | 1/1991 | Japan . |
| 6-112442 (A) | 4/1994 | Japan . |
| 6-112479 (A) | 4/1994 | Japan . |

*Primary Examiner*—Tom Thomas
*Assistant Examiner*—Adriana Giordana
*Attorney, Agent, or Firm*—Harry A. Wolin; Ziye Zhou

[57] ABSTRACT

An object of the present invention is to contribute to increase of storage capacity of a memory and to cope with an nonlinear parasitic resistance.

The non-volatile memory have a cell applying to multi-bit data by means of a double layered floating gate architecture. The cell comprises: heavily doped layers (drains $3_0$–$3_2$ and source 2) being formed separated from each other along an arrangement direction L in a semiconductor substrate; a first floating gate 4A being disposed along a direction orthogonal to the direction L between the drains and source above the semiconductor substrate; second floating gates $4B_1$, $4B_2$ which respectively extend across the first floating gate above the first floating gate and lie along the direction L, close to the drain; program gates $6_1$, $6_2$ disposed correspondingly to one of the second floating gates; and a control gate 5 extending across the gate 4A above the gate 4A and being disposed along the direction L, close to the source.

Since the second floating gates individually store carriers corresponding to a data bit and the first floating gate determines a threshold voltage in accordance with a sum amount of carriers stored in all of the second floating gates, two or more bits of data can be saved per one storage cell. It is possible to avoid influence of nonlinear parasitic resistance because a transistor formed by the first floating gate and the control gate is used exclusively for reading.

12 Claims, 11 Drawing Sheets

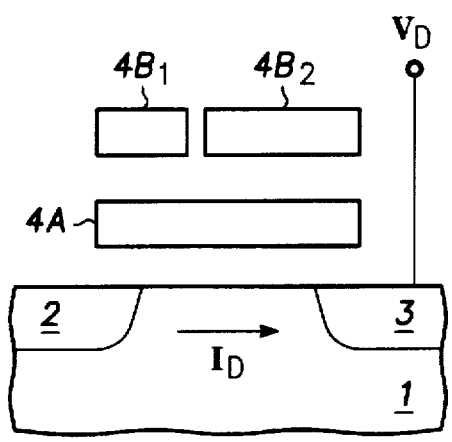
FIG. 4
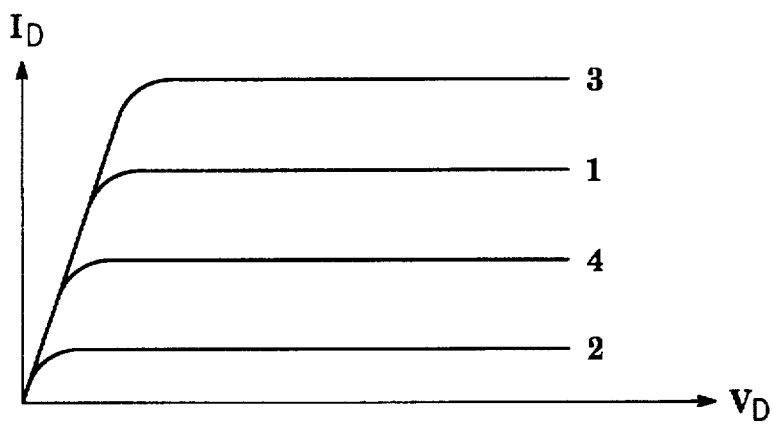
FIG. 5
FIG. 6 a~d: IDEAL CHARACTERISTICS OF EACH MEMORY STATE a'~d': REAL CHARACTERISTICS OF EACH MEMORY STATE UNDER PARASITIC RESISTANCE

5,753,950

NON-VOLATILE MEMORY HAVING A CELL APPLYING TO MULTI-BIT DATA BY DOUBLE LAYERED FLOATING GATE ARCHITECTURE AND PROGRAMMING/ERASING/READING METHOD FOR THE SAME

FIELD OF THE INVENTION

The present invention relates to a non-volatile memory, and in particular, to a memory in which a storage cell is comprised of a transistor having a floating gate architecture. The invention also relates to a programming, erasing and reading method for the memory.

BACKGROUND OF THE INVENTION

A non-volatile memory comprised of storage cells formed by transistors having floating and control gates is described, for example, in "S. Keeny et al., 'Complete Transient Simulation of Flash E$^2$PROM Devices' IEEE ED-39, No. 12 Dec., 1992". The basic structure of this storage cell is shown in FIG. 1.

In FIG. 1, the storage cell is comprised of a MOS field effect transistor (typically, a so-called self aligned MOS transistor) having: a source 2 and a drain 3 formed in a substrate 1 made of a doped semiconductor, such as a p-type silicon; a floating gate 4 disposed along and over a source/drain channel, and surrounded by an insulator such as an oxide; and a control gate 5 formed over the gate 4 with said oxide disposed therebetween. FIG. 1 (a) illustrates how the cell is written or programmed, where when the gate voltage $V_G$ and drain voltage $V_D$ are pulled to a high level, hot electrons are developed, and then stored at the floating gate 4. FIG. 1 (b) shows how the stored information in the cell is erased, where by pulling the source voltage $V_S$ to a high level, the electrons stored at the floating gate 4 are pulled into the source 2, thereby causing holes to be stored at the floating gate 4. That is, by controlling the carriers in the floating gate 4, the information storage state in one cell is produced. For example, a program state and an erase state are assigned to a logic "0" and a logic "1", respectively.

FIG. 2 shows drain current $I_D$ vs. gate voltage $V_G$ characteristics in the program and erase states of the memory cell whose storage state is determined in that way.

However, in such cells, because one cell only assumes two states, and thus may store only binary information (i.e., one bit of binary data), it has a disadvantage that it cannot sufficiently accommodate today's increasing needs for greater memory capacity.

On the other hand, in order to secure integrity of stored information, consideration should also be given to leakage current and parasitic resistance.

Accordingly, it is an object of the present invention to provide a non-volatile memory that can make a contribution to increased memory capacity, and its programming/erasing/reading method. It is another object of the present invention to provide a non-volatile memory architecture that eliminates the influence of nonlinear parasitic resistance during its reading.

SUMMARY OF THE INVENTION

A non-volatile memory having a cell applying to multi-bit data by means of a double layered floating gate architecture, which is characterized by a storage cell transistor comprising:

heavily doped layers being formed apart from each other along a predetermined arrangement direction in a semiconductor substrate, said heavily doped layers serving as a source and a drain;

a single first floating gate being disposed along a direction orthogonal to said predetermined arrangement direction between one of said heavily doped layers and the other of said heavily doped layers over a principal plane of said semiconductor substrate;

a plurality of second floating gates which respectively extend across said first floating gate over a principal plane of said first floating gate and lie along said predetermined arrangement direction, close to one of said heavily doped layers;

a plurality of program gates, each being disposed over a principal plane of each of said second floating gates; and a control gate extending across said first floating gate over a principal plane of said first floating gate and being disposed along said predetermined arrangement direction, close to the other of said heavily doped layers.

In this non-volatile memory, a transistor section comprised of either one of said heavily doped layers, said first floating gate, and said control gate is a specific functional transistor having a function different from the program.

A programming method according to the present invention, which programs said non-volatile memory, comprises:

applying a high voltage to one of said heavily doped layers and said program gate, and injecting hot electrons generated thereby near one end of one of said heavily doped layers into said second floating gates through a field developed between said program gate and said semiconductor substrate.

An erasing method according to the present invention, which erases information programmed into said non-volatile memory, comprises:

applying a high positive voltage to the other of said heavily doped layers, and pulling electrons stored at the second floating gates into the other of said heavily doped layers in said predetermined arrangement direction of said second floating gates.

A reading method according to the present invention, which reads information from said non-volatile memory, comprises:

using said specific functional transistor section to read the stored information, applying a predetermined voltage to said control gate, and detecting a channel current developed in the semiconductor substrate opposite said first floating gate.

With the non-volatile memory having a cell applying to multi-bit data by means of a double layered floating gate architecture according to the present invention, and its programming/erasing method, carriers corresponding to a data bit are stored on each of said second floating gates, and the first floating gate determines a drain current threshold in accordance with the sum of carriers stored on all the second floating gates. With the reading method according to the present invention, the specific functional transistor section comprised of the first floating gate and control gate serves as a separate reading transistor independent of the program.

BRIEF DESCRIPTION OF THE DRAWINGS

FIG. 4 is a cross-sectional view depicting the structure of the storage cell based on the structure of FIG. 3, where two second floating gates are used.

FIG. 5 is a table showing storage states of the storage cell.

FIG. 6 is a drain current $I_D$ vs. drain voltage $V_D$ characteristics chart in various storage states in the table of FIG. 5.

DETAILED DESCRIPTION OF A PREFERRED EMBODIMENT

The present invention is described in detail below with reference to the accompanying drawings.

Figure 1:
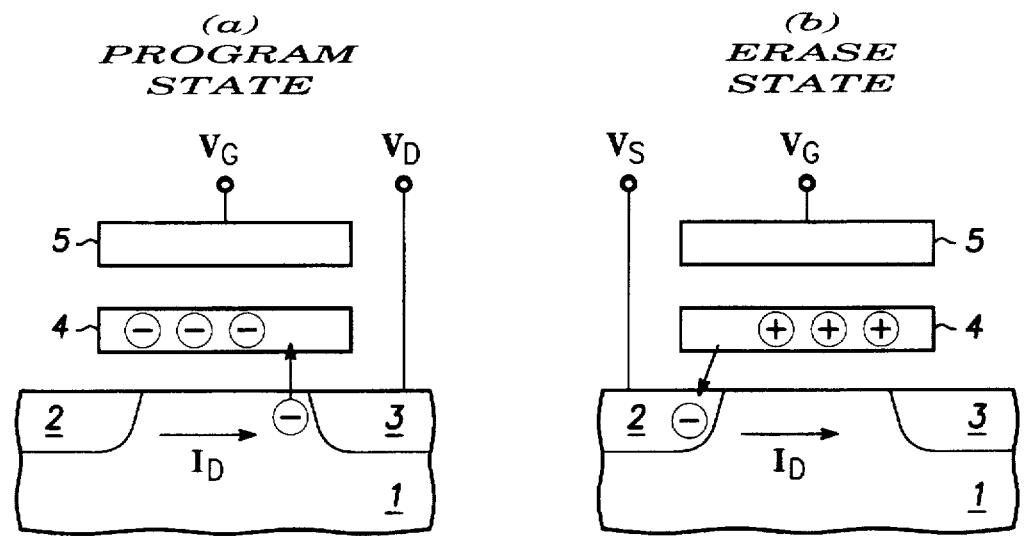
FIG. 1 is a cross-sectional view depicting the basic structure of a storage cell formed by a transistor having floating and control gates.
Figure 2:
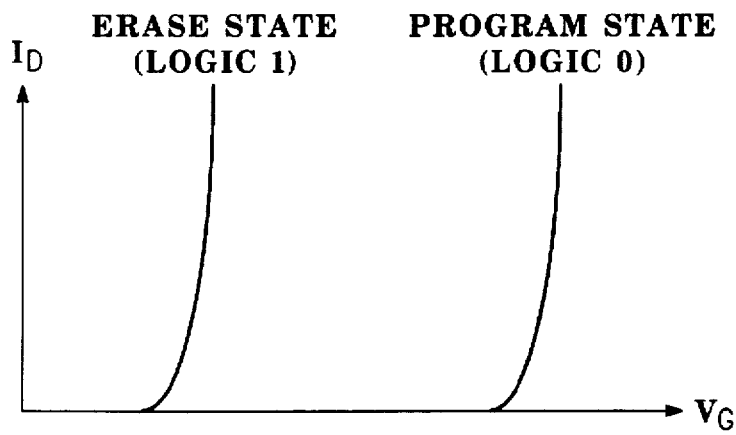
FIG. 2 is a drain current $I_D$ vs. gate voltage $V_G$ characteristics chart in program and erase states of the memory cell of FIG. 1.
Figure 3:
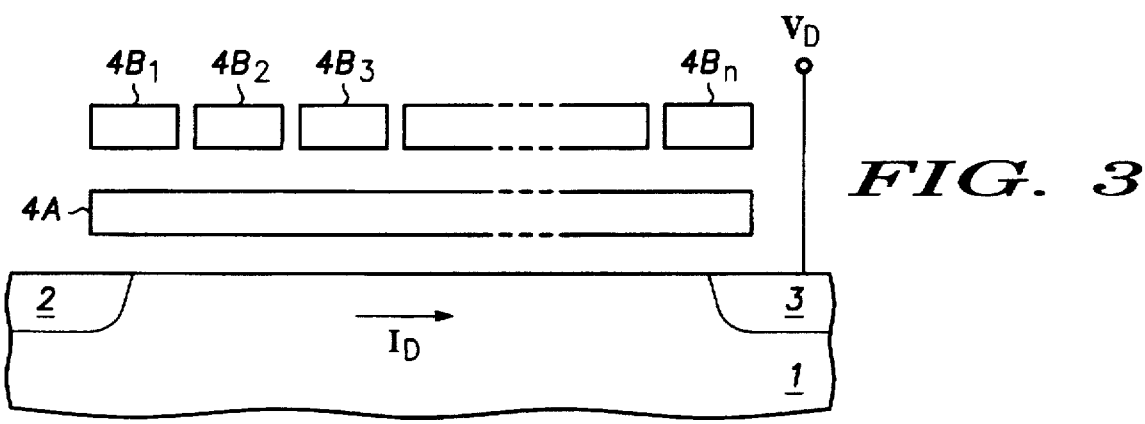
FIG. 3 is a cross-sectional view depicting the basic structure of a storage cell of a non-volatile memory according to the present invention.

FIG. 3 shows a storage cell architecture of a non-volatile memory according to one embodiment of the present invention, where like reference symbols denote like parts of FIG. 1.

In FIG. 3, the transistor of such a memory cell includes: a source 2 and a drain 3 of heavily doped layers formed on a substrate 1 made of an impurity semiconductor, such as a p-type silicon; a first floating gate 4A disposed along and over a channel between the source and drain (or stacked thereover) and surrounded by an oxide; and at least two second floating gates $4B_x$ (where x=1, 2, 3, ..., n) formed over the longitudinal gate 4A (or stacked thereover) and disposed apart from each other, said at least two second floating gates being surrounded by the oxide. The first and second floating gates are formed of polysilicon, for example, and surrounded by $SiO_2$.

The second floating gates are individually charged with electrons, or programmed with information, with a programming technique described later. While the electrons (holes) charged are discharged, the information is erased. As may be apparent later, the carriers charged on each of the second floating gates control the level of drain current $I_D$. Thus, by individually corresponding each of the second floating gate with a bit of data to be stored and charging carriers to the second floating gate in accordance with that bit of data, the same number of bits of data as the number of second floating gates may be stored.

FIG. 4 may be used to clearly explain this in greater detail. FIG. 4 shows the storage cell architecture based on the architecture of FIG. 3, where there are two second floating gates, with like reference symbols denoting like parts of FIG. 3.

In FIG. 4, the second floating gate $4B_1$ close to the source 2 is formed with a smaller effective area for storing carriers on a plane facing the first floating gate and on its opposite plane, than with the second floating gate $4B_2$ close to the drain 3. With both of these floating gates, the amount of chargeable carriers is set according to their effective areas. As shown in FIG. 5, assuming that a holes-charged state and neutral state between the gates $4B_1$ and $4B_2$ is assigned a logic "1", whereas an electrons-charged state is assigned a logic "0", then four possible states are obtained for this cell.

The resulting drain current $I_D$ vs. drain voltage $V_D$ characteristics are shown in FIG. 6. This indicates that four drain current values obtained with respect to the drain voltage are all different from each other; the effective area of the second floating gate $4B_2$ is greater than that of $4B_1$ by a predetermined value, so the drain current values drop in order of reference numerals 3, 1, 4, and 2 indicative of the drain current states in the table of FIG. 5; thus, four kinds of storage states are obtained for one cell. Likewise, by making the effective areas of n second floating gates in FIG. 3, $2^n$ kinds of storage states could be obtained.

Such states may be further analyzed as follows.

Figure 7:
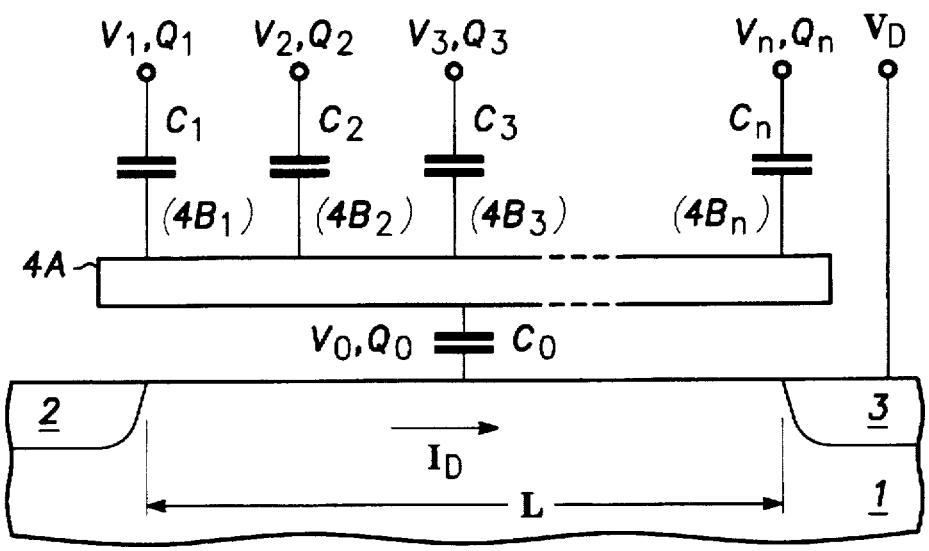
FIG. 7 is a diagram illustrating an equivalent circuit of the storage cell of FIG. 3.

First of all, an equivalent circuit of the storage cell of FIG. 3 is shown in FIG. 7. With this equivalent circuit, each of the oxides between the second floating gate (FG2) and the first floating gate 4A may be replaced by capacitance $C_x$ (where x=1, 2, ..., n) having a voltage $V_x$ and a charge $Q_x$; in addition, one end of the capacitance is commonly connected at the first floating gate 4A (FG1), a source-drain channel of the substrate 1 and the first floating gate 4A are connected through a capacitance $C_0$ having a voltage $V_0$ and a charge $Q_0$.

In such an equivalent circuit, the total amount of charges stored on all the second floating gates, $Q_{FG2}$, is expressed as:

$$Q_{FG2} = \sum_{i=1}^{n} Q_i = \sum_{i=1}^{n} C_i(V_i - V_0) \quad (1)$$

The total amount of charges stored on the first floating gate 4A, $Q_0$, is given by:

$$Q_0 = C_0 (V_0 - V_{sub}) \cdots \quad (2)$$

where $V_{sub}$ is a potential at the semiconductor substrate 1.

According to conservation of charge, $$Q_{FG2} = Q_0 \cdots \quad (3)$$

So, the voltage at the first floating gate 4A is defined by:

$$V_0 = \left( \sum_{i=1}^{n} C_i V_i + C_0 V_{sub} \right) / \sum_{i=0}^{n} C_i \tag{4}$$

When the drain current is in its threshold state where it turns on (rises), the source-drain surface potential of the substrate 1 changes to $2\Phi_f$ (where $\Phi_f$ is a difference between energy $E_i$ at the center of the forbidden band and Fermi level $E_F$) (thus, $V_{sub}=2\Phi_f$), so the threshold voltage $Vth_{FG1}$ of the first floating gate may be expressed as:

$$Vth_{FG1} = \left( \sum_{i=1}^{n} C_i V_i + C_0 \cdot 2\Phi_f \right) / \sum_{i=0}^{n} C_i \tag{5}$$

Then, $Q_0$ is equal to the charge $Q_{dep}$ in the depletion mode, so the following relationships are met:

$$C_0(Vth_{FG1} - 2\Phi_f) = \sqrt{2\epsilon_{\phi}qN_{sub} \cdot 2\Phi_f} \tag{6}$$

$$Vth_{FG1} = 2\Phi_f + \sqrt{2\epsilon_{\phi}qN_{sub} \cdot 2\Phi_f} / C_0 \tag{7}$$

where:

$E_\phi$ is a dielectric constant of semiconductor substrate 1;
q is the absolute value of the charge of an electron; and
$N_{sub}$ is a dopant concentration of semiconductor substrate 1.

With the drain current in its on state, $V_0 > Vth_{FG1}$, and the voltage at the first floating gate 4A is given by:

$$V_{FG1} > 2\Phi_f + \sqrt{2\epsilon_{\phi}qN_{sub} \cdot 2\Phi_f} / C_0 \tag{8}$$

The drift channel current may be expressed as:

$$I_D = \mu Q_N E \ldots \tag{9}$$

where:

μ is electron mobility; and
E is a channel's lateral field.

$Q_N$, which represents the charge in the inverting layer, may be written as:

$$Q_N = C_0 (V_1 - Vth_{FG1} - V) \ldots \tag{10}$$

where V is a channel voltage.

$$I_D = \mu W C_0 (V_0 - Vth_{FG1} - V)(dV/dy) \ldots \tag{11}$$

where:

W is a channel width; and
dy is a channel direction differential length.

Integrating the channel current from the source to the drain yields:

$$\int_0^L I_D dy = \int_0^{V_D} \mu W C_0 (V_0 - Vth_{FG1} - V) dV \tag{12}$$

where L is an effective channel length.

$$I_D = (W/L)\mu C_0[(V_0 - Vth_{FG1})V_D - 0.5 V_D^2] \ldots \tag{13}$$

Thus, as may be clear from Eq. (5), the threshold voltage of the first floating gate for conducting a drain current is determined by the sum of charges stored at the second floating gates. More specifically, the first floating gate serves to determine, indirectly, the operation of the cell transistor according to the sum of charges stored at the second floating gates. In addition, the presence of the first floating gate 4A enables a single cell transistor to handle different threshold voltages. Furthermore, because summing of charges, i.e., summing of signals is done through capacitive coupling (electrostatic coupling) in the voltage mode, charge itself need not be moved, so the power required for that summation is equal to zero (0). In the example of FIG. 4, by making the effective areas of the second floating gates different from each other and varying the carrier storage amount, or values of capacitances $C_1$ and $C_2$ at each gate to perform so-called weighting, four summation results are obtained. Likewise, by making the effective areas of n second floating gates in FIG. 3 different from each other, $2^n$ kinds of storage states could be obtained.

On the other hand, if the second floating gates $4B_1$ and $4B_2$ are formed with the same area, and electrons are injected into each of the second floating gates with an equal bias, then equivalent drain currents would be obtained for states 1 and 4 of the drain current shown in FIG. 5, so only three kinds of states could be obtained for one cell; even in this case, however, there is an advantage in that three or more states could be produced for one cell. It is necessary, however, to account for the fact that only three storage states could be obtained for two data bits of input.

Figure 8:
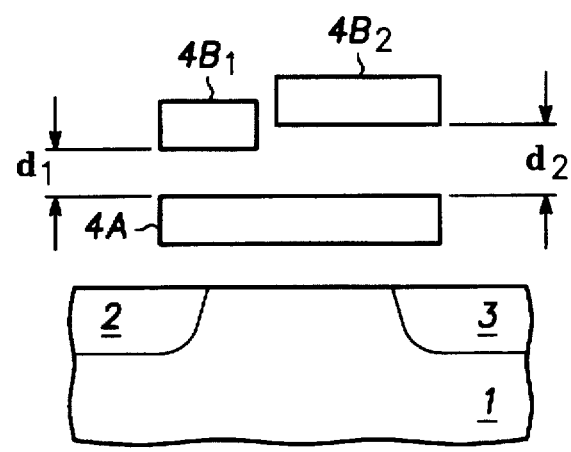
FIG. 8 is a cross-sectional view depicting an alternate embodiment of the structure of FIG. 4.

FIG. 8 shows an alternate embodiment of the architecture of FIG. 4, where for each of the second floating gates, their effective areas described above are made equal to each other, and the distance from the other second floating gate $4B_2$ to the first floating gate 4A is set longer than that from one second floating gate $4B_1$ to the first floating gate 4A. In other words, $d_1 < d_2$. Even with such an architecture, because the carrier storage capacities of the second floating gates are different, four storage states can be produced as described in FIGS. 5 and 6. Similarly, by making the distances of n second floating gates in FIG. 3 with respect to the first floating gate 4A different from each other, values of capacitances $C_1$ through $C_n$ in the equivalent circuit of FIG. 7 may be made different, thereby producing $2^n$ types of storage states.

It should be appreciated that values of $C_1$ through $C_n$ are dependent not only upon their electrode areas, i.e., the facing areas of the gates, and the gap between the electrodes, i.e., each gate-to-gate distance, but also upon characteristics of intermediate material between the gates. Therefore, when fabricating the storage cell, either of the parameters that determine those capacitance values may be set to a desired level. Further, as shown in FIG. 6, in order that drain current characteristics are different from each other for each of the storage states, values of $C_1$ through $C_n$, as well as values of $Q_1$ through $Q_n$, may be set so that $2^{n-1}$ kinds of Vth values are obtained. Values of $Q_1$ through $Q_n$ are determined by each injection energy at the time when electrons are injected into each second floating gate during programming.

It has been described so far that a plurality of second floating gates stacked with a single first floating gate disposed therebetween and having an appropriate size (i.e., carrier storage capacity) are provided in a single cell, and carriers corresponding to each bit of data may be stored thereon, whereby a single cell can assume multiple data bits; below is described a specific carrier storage method, that is, a programming/erasing method.

Figure 9:
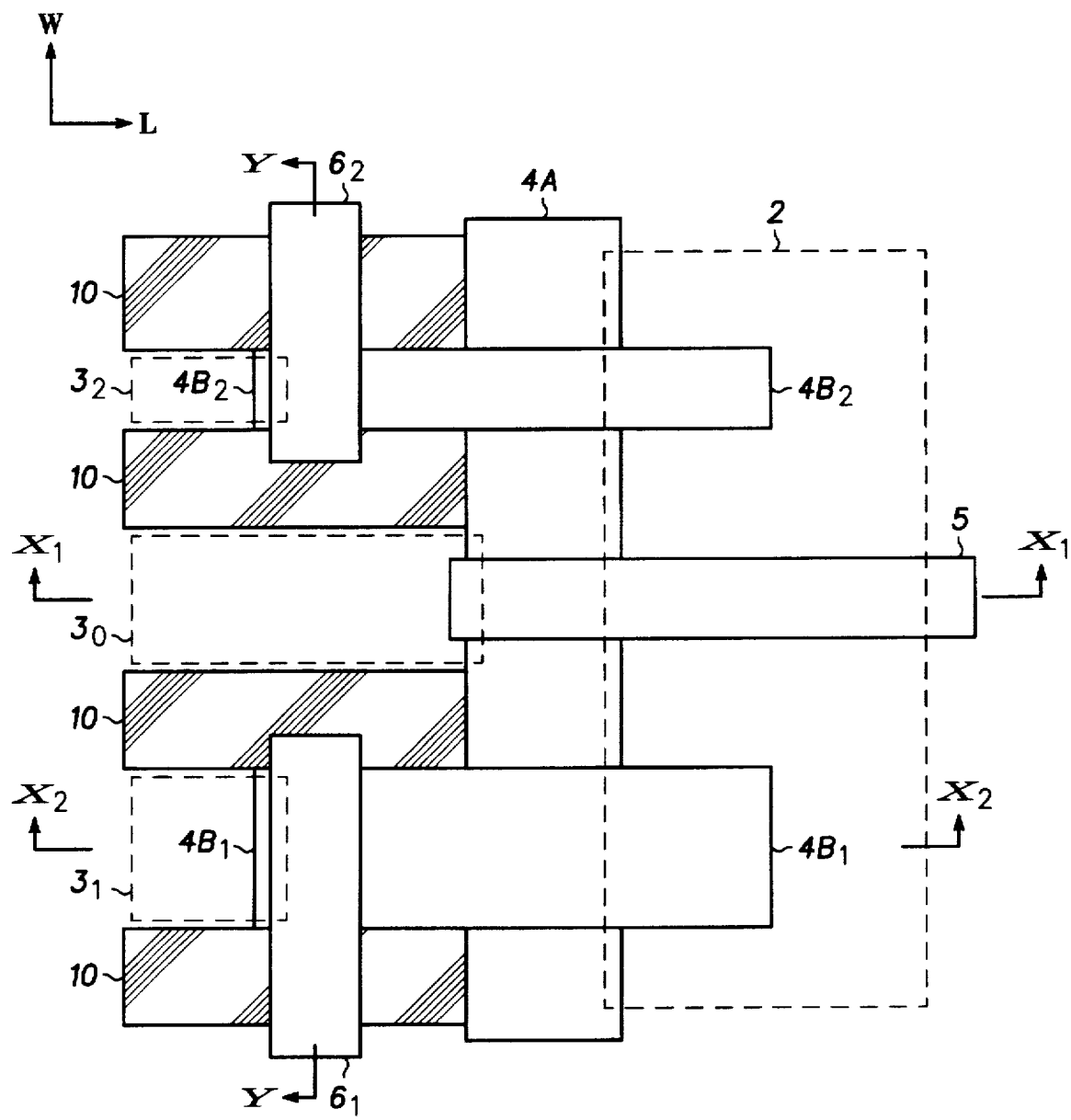
FIG. 9 is a plane view illustrating the structure of the storage cell based on the structure of FIG. 4 according to one embodiment of the present invention, wherein carriers are stored at the second floating gates using hot carrier injection.
Figure 10:
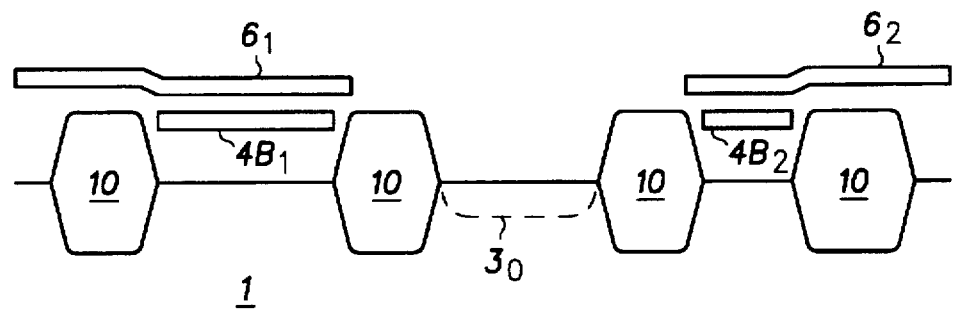
FIG. 10 is a cross-sectional view along Y—Y of the storage cell of FIG. 9.
Figure 11:
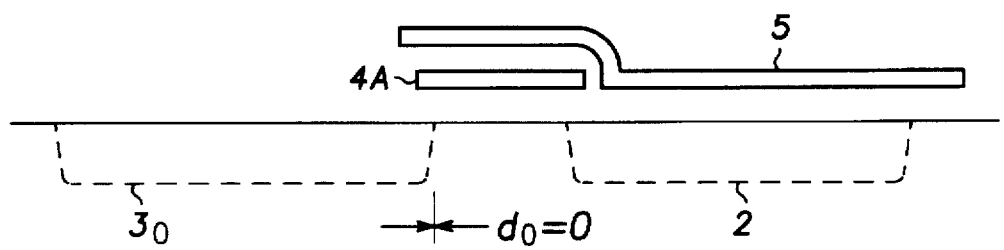
FIG. 11 is a cross-sectional view along $X_1$—$X_1$ of the storage cell of FIG. 9.
Figure 12:
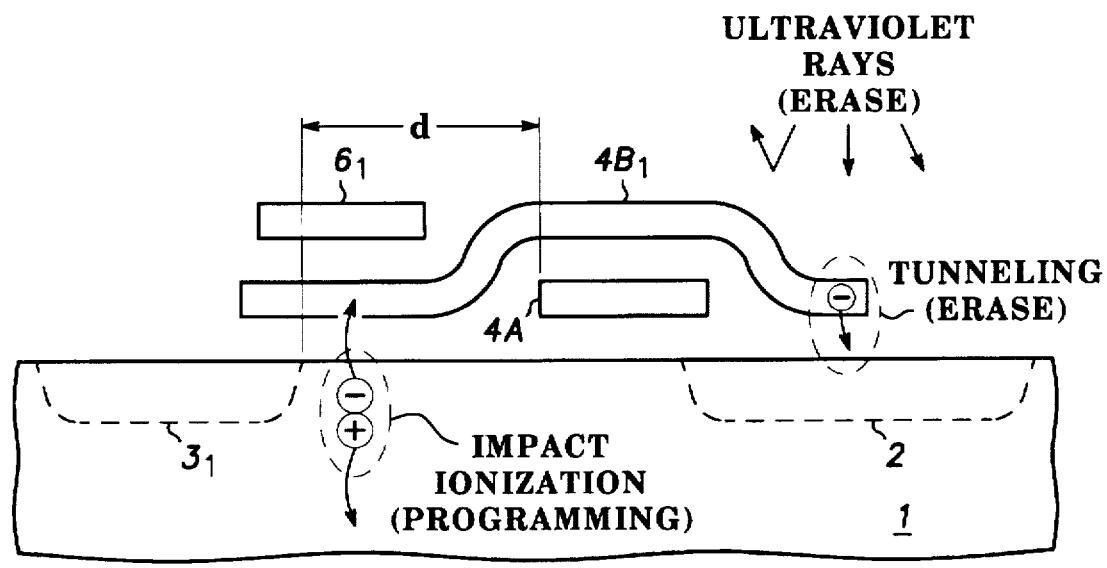
FIG. 12 is a cross-sectional view along $X_2$—$X_2$ of the storage cell of FIG. 9.

FIG. 9 is a plane view illustrating the storage cell architecture where so-called hot carrier injection is used to program two second floating gates separately; FIG. 10 is a cross-sectional view along Y—Y thereof; FIG. 11 is a cross-sectional view along $X_1$—$X_1$ thereof; FIG. 12 is a cross-sectional view along $X_2$—$X_2$ thereof. In those figures, like parts equivalent to those shown in FIG. 4 are denoted by the same reference symbols.

In FIGS. 9–12, a single storage cell has three drains $3_0$, $3_1$, and $3_2$ in their defined areas; these drains are separated from source 2 and from each other along a predetermined arrangement direction L in a semiconductor substrate 1. The source 2 extends along a direction W, which is orthogonal to the arrangement direction L; the drain $3_0$ for forming a reading transistor is disposed away from the center of the source 2 by a predetermined distance along the arrangement direction L. The drains $3_1$ and $3_2$ for forming programming transistors are disposed at both sides along the direction W of the drain $3_0$, and also located apart from the source 2, by significantly more than said predetermined distance along the arrangement direction L.

A first floating gate 4A made of polysilicon surrounded by an oxide, such as, for example, $SiO_2$, is formed in a longitudinal form extending along the direction W, and arranged so that it crosses between the source 2 and drain $3_0$, between the source 2 and drain $3_1$, and between the source 2 and drain $3_2$ on the overlying layer relative to the substrate 1. On the overlying layer of the first floating gate 4A relative to the substrate 1, there are disposed second floating gates $4B_1$ and $4B_2$ made of polysilicon surrounded by an oxide such as, for example, $SiO_2$. The second floating gates $4B_1$ and $4B_2$ are separated from each other, and formed in a longitudinal form that crosses orthogonally to the extending direction W of the first floating gate 4A and also extends along the direction L from the end of the source 2. The second floating gates $4B_1$ and $4B_2$ are also formed in such a manner that they are adjacent to the substrate 1 (source 2) by an approximately equal distance with respect to the layer of the first floating gate 4A, excluding areas where they generally overlap the first floating gate 4A in the thickness direction. Thus, the second floating gates $4B_1$ and $4B_2$ have a so-called cap shape that partially overlaps the first floating gate 4A along the direction L. With these gates $4B_1$ and $4B_2$, the effective areas as described in conjunction with FIG. 4 are set by the width in the direction W.

A polysilicon gate (hereinafter referred to as a control gate) 5 is further disposed, similarly via an oxide, on the overlying layer of the first floating gate 4A with respect to the substrate 1. The control gate 5 is formed in a longitudinal shape that crosses orthogonally to the extending direction W of the first floating gate and extends along the direction L from the end of the drain 3. The control gate 5 is also formed so that it is adjacent to the substrate 1 (source 2) by an approximately equal distance with respect to the layer of the gate 4A, excluding areas it overlaps the first floating gate 4A in the thickness direction.

One end of polysilicon gates (hereinafter referred to as program gates) $6_1$ and $6_2$ overlaps at the end of the drains $3_1$ and $3_2$ along the direction L of the second floating gates $4B_1$ and $4B_2$. The program gate $6_1$ is formed in a longitudinal form that crosses orthogonally to the extending direction L of one of the second floating gates $4B_1$ and also extends along the direction W from the end of the drain $3_0$ in the direction W of that gate $4B_1$; the program gate $6_2$ is formed in a longitudinal form that crosses orthogonally to the extending direction L of the other of the second floating gates $4B_2$ and also extends along the direction W from the end of the drain $3_0$ in the direction W of that gate $4B_2$.

The drains $3_0$, $3_1$, and $3_2$ are sandwiched between insulating layers (so-called fields) made of an electrically insulative material formed on the substrate 1. Such insulating layers 10 are formed so that they sandwich the second floating gates $4B_1$ and $4B_2$. The program gates $6_1$ and $6_2$ extend from the substrate 1 of the insulating layer 10 to the overlying layer, excluding areas where they overlap the second floating gates $4B_1$ and $4B_2$ in the thickness direction.

The second floating gate $4B_1$ in conjunction with the program gate $6_1$ and drain $3_1$, and the second floating gate $4B_2$ in conjunction with the program gate $6_2$ and drain $3_2$, form, together with the common source 2, respective transistors for separately programming input bits, i.e., the second floating gates, thereby forming a pair of one-bit blocks.

Figure 13:
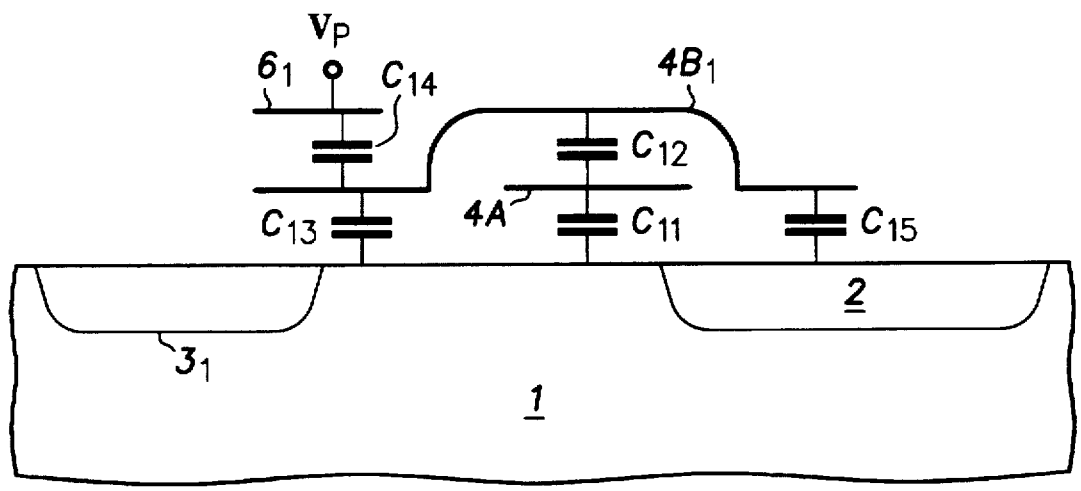
FIG. 13 is an equivalent circuit diagram of a one-bit application block for a programming transistor of the storage cell of FIG. 9.
Figure 13:
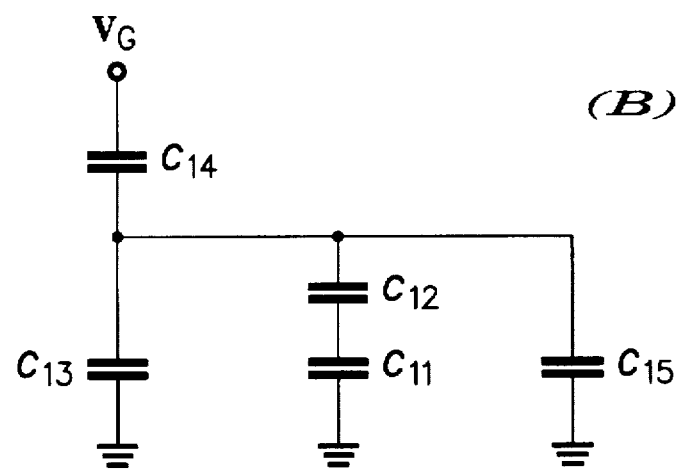

FIG. 13 shows an equivalent circuit of the former one-bit block of the storage cell transistor. As shown in FIG. 13 (A), the oxide between the substrate 1 and the first floating gate 4A may be replaced by a capacitor $C_{11}$; the oxide between the first floating gate 4A and the second floating gate $4B_1$ may be replaced by an capacitor $C_{12}$; the oxide between the substrate 1 and one end of the second floating gate $4B_1$ may be replaced by a capacitor $C_{13}$; the oxide between one end of the second floating gate $4B_1$ and one end of the program gate $6_1$ may be replaced by a capacitor $C_{14}$; the oxide between the source 2 on the substrate 1 and one end of the second floating gate $4B_1$ may be replaced by a capacitor $C_{15}$. This may also be illustrated as a circuit diagram of FIG. 13 (B).

The amount of charge stored on the second floating gate $4B_1$ is determined by the coupling of each capacitor. For example, the value of capacitor $C_{12}$ is approximately determined by the thickness $t_{ox}$ of the oxide as shown in FIG. 13 (A) and the electrode area which forms that capacitor, i.e., an overlapping area along the thickness direction of the first floating gate 4A and second floating gate $4B_1$. Thus, by setting this thickness or area while varying it for each second floating gate, weighting described in conjunction with FIGS. 4 and 8 may be done. In addition, weighting may also be done by varying the capacitance for other than $C_{12}$.

With the storage cell of such an architecture, by applying a high voltage to the drains $3_1$, $3_2$ and program gate $6_1$ or $6_2$ in the program mode, a channel is formed between the source 2 and drain $3_1$, $3_2$; additionally, a drain voltage applied causes impact ionization at the edge of the drain, where hot electrons are generated. Then, a field between the program gate $6_1$ or $6_2$ and the substrate 1 pulls up the electrons generated, which are then injected into the second floating gate $4B_1$ or $4B_2$. Then, electrons are difficult to be injected into the first floating gate 4A, because it is isolated from the edge of the drain $3_1$, $3_2$. Because the program gates are formed corresponding to each of the second floating gates, they may be programmed independently of each other corresponding to each of the second floating gates. Carrier injection into the second floating gates through such hot carrier injection allows for significantly faster programming.

Hot electrons generated during program execution for one of the second floating gates are difficult to be injected into the other of the second floating gates. In other words, drains that generate hot electrons are independent of each other; in addition, movement of carriers to the outer edge of each drain is blocked by the insulating layer 10, so the breakdown strength for each of the second floating gates is improved, thereby minimizing the leakage current developed during programming.

In the erase mode, not only ultraviolet-ray erasure, but also electrical erasure through a field emission of Fowler-Nordheim type can be done. For this electrical erasure, the second floating gates $4B_1$ and $4B_2$ are formed so that they overlap the source 2 in the afore-described cap shape, and a thin oxide film (tunnel oxide film) lies between the second floating gate and the source. With this electrical erasure, electrons stored, or programmed, on the second floating gates $4B_1$ and $4B_2$ are pulled down into the source 2 via said tunnel oxide film by applying a sufficiently high positive voltage to the source 2.

On the other hand, in the read mode for stored information, a reading (sense) transistor formed by the drain $3_0$, first floating gate 4A, and source 2 works. This reading transistor may be operated independently of the programming transistor that is formed with the drains $3_1$, $3_2$, as described above.

More specifically, by applying a predetermined voltage to the control gate 5 to sense the amount of current flowing between the drain $3_0$ and source 2, the threshold voltage for the first floating gate 4A determined by the sum of charge stored on the second floating gates $4B_1$ and $4B_2$ is known, so that the stored information can be read out without forming a channel between the drain $3_1$, $3_2$ and the source 2. This reading transistor is similar in structure to a typical MOS transistor for an EEPROM; the drain $3_0$ and first floating gate 4A are very close to each other. That is, the channel length is made as short as possible. Thus, parasitic components (such as parasitic resistance and parasitic capacitance) are unlikely to occur between the drain $3_0$ and the first floating gate 4A. Especially, parasitic resistance would have adverse influence during read-out.

Figure 14:
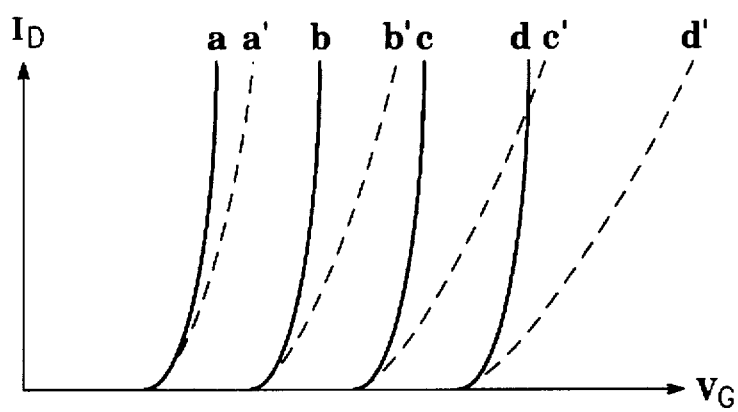
FIG. 14 is a drain current $I_D$ vs. control gate voltage $V_G$ characteristics chart in various storage states for explaining the influence of the storage cell of FIG. 9.

As shown in FIG. 12, for example, if the drain $3_1$ is separated from the source 2 by a distance $d_1$ parasitic resistance induced by this distance d occurs, so that drain current $I_D$ characteristics relative to control gate voltage $V_G$ will not retain linearity as indicated by doted line of FIG. 14. In contrast, the reading transistor formed with the drain $3_0$ has no such distance (see FIG. 11), so that parasitic resistance will not occur, and it can thus retain linearity as indicated by solid line of FIG. 14. In actuality, collapse of linearity due to parasitic resistance would complicate the architecture of a sense amplifier that senses such drain current in the read-out mode. That is because the drain current must be sensed in consideration of nonlinear components.

Small parasitic resistance components translate to improved response of the reading transistor itself, thereby enhancing the read-out speed and reducing power consumption. On the other hand, because the reading transistor is electrically isolated from the program gate, there is another advantage that a problem of so-called "soft erase/write" relative to the second floating gates during read-out will be unlikely to occur.

Furthermore, because self-alignment is employed for each drain so that it is formed after the formation of the insulating layer 10, first and second floating gates 4A, $4B_1$, and $4B_2$, any mask for defining drain regions is unnecessary.

Figure 15:
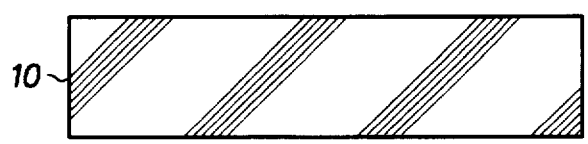
FIG. 15 is a diagram illustrating how insulating layers are formed in the fabrication process for the storage cell of FIG. 9.
Figure 15:
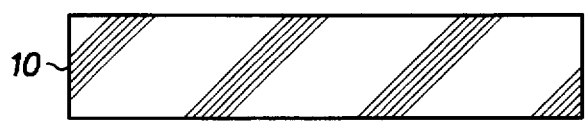
Figure 15:
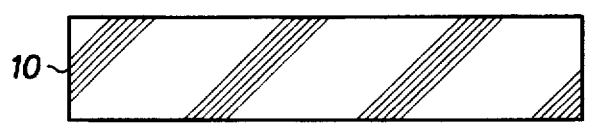
Figure 15:
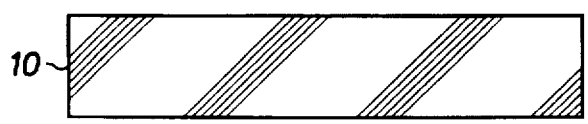
Figure 16:
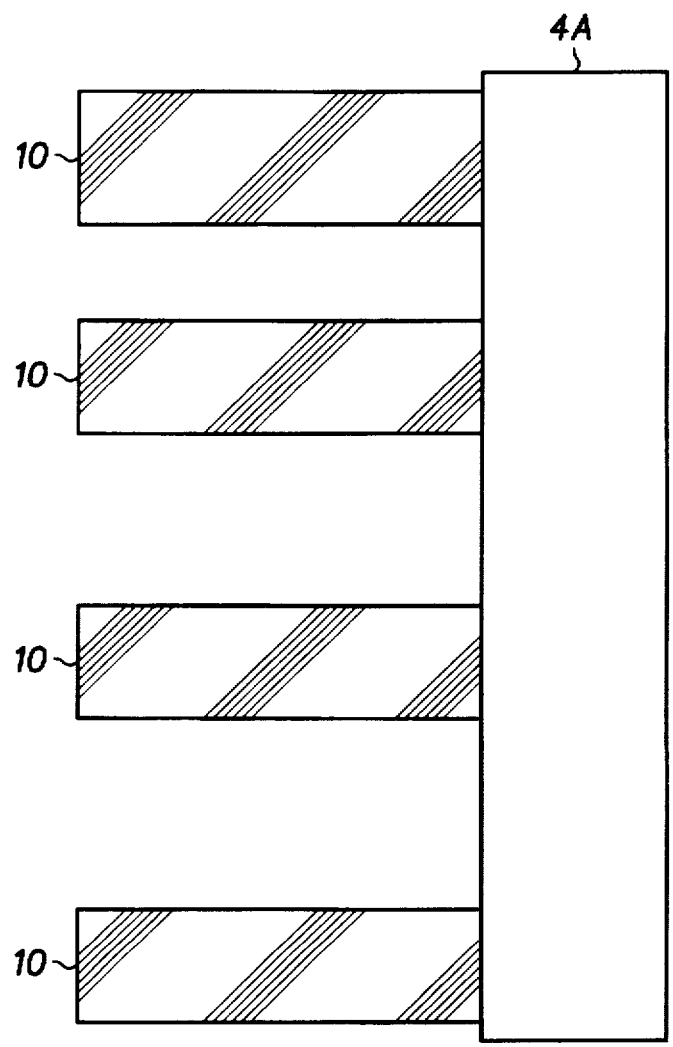
FIG. 16 is a diagram illustrating how the first floating gate is formed in the fabrication process for the storage cell of FIG. 9.
Figure 17:
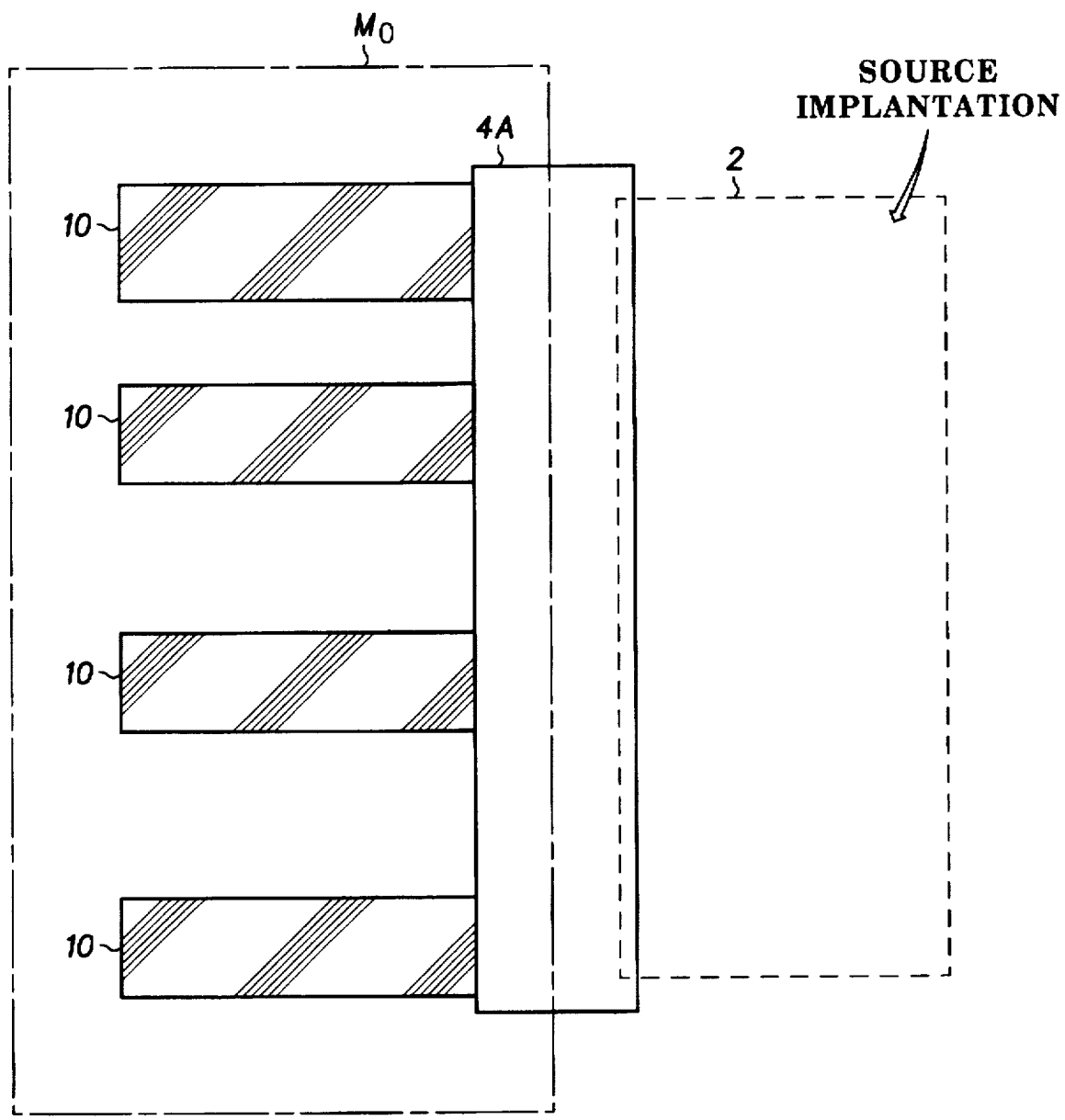
FIG. 17 is a diagram illustrating how the source is formed in the fabrication process for the storage cell of FIG. 9.

FIGS. 15–19 show a fabrication process for the present memory cell; first, as shown in FIG. 15, in a so-called active area dedicated for a memory, a field insulating layer 10 is formed on a semiconductor substrate 1, and a fist floating gate 4A, which serves as a first layer of polysilicon gate, is then formed as shown in FIG. 16. Then, the insulating layer 10 is covered by a mask M0 nearly from the center of the first floating gate 4A; in order to form a source 2 under this condition, ion implantation or thermal diffusion is performed. In this way, during the formation of the source 2, the first floating gate serves as a partial mask (a mask for defining a source region), whereby self-alignment implantation is achieved, so that the edge of the source 2 and the first floating gate are well aligned without being offset in structure.

Figure 18:
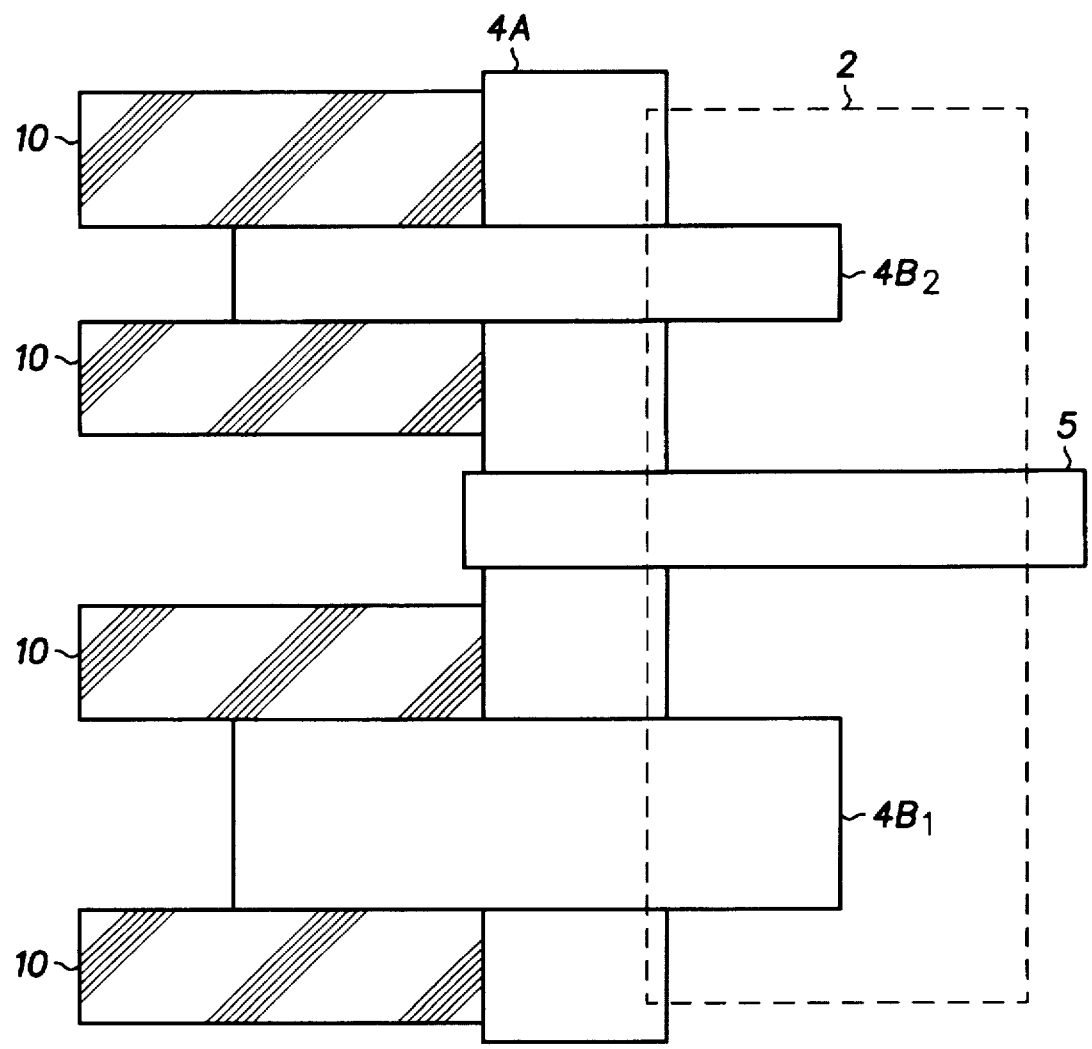
FIG. 18 is a diagram illustrating how the second floating gate and control gate are formed in the fabrication process for the storage cell of FIG. 9.
Figure 19:
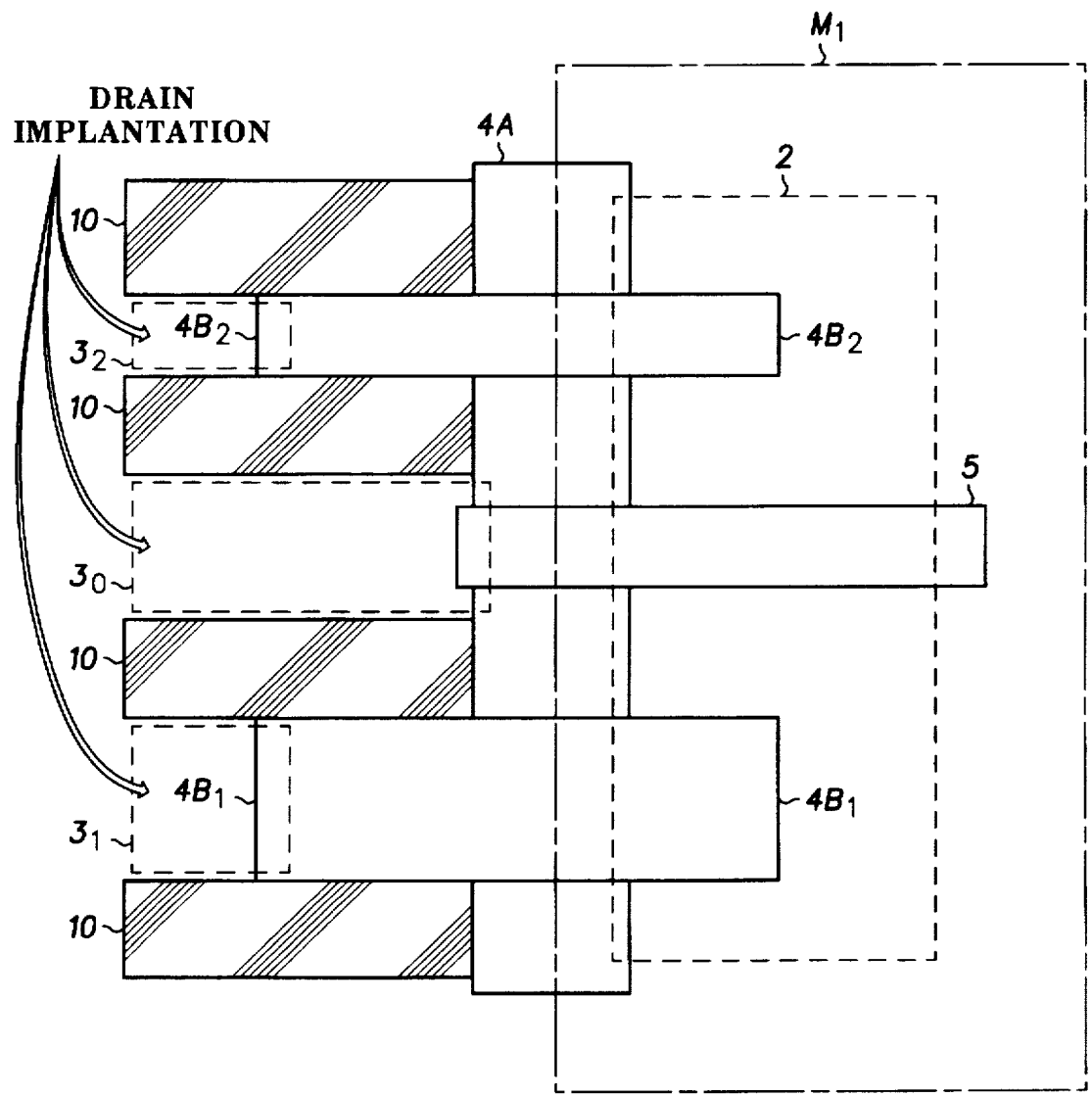
FIG. 19 is a diagram illustrating how the drain is formed in the fabrication process for the storage cell of FIG. 9.

After the formation of the source 2, second floating gates $4B_1$ and $4B_2$, which serve as second layers of polysilicon gate, as well as a control gate 5, are formed, as shown in FIG. 18. Then, as shown in FIG. 19, the source 2 is covered by a mask M1 nearly from the center of the first floating gate 4A; in order to form drains $3_0$, $3_1$, $3_2$ under this condition, ion implantation or thermal diffusion is performed. In this way, during the formation of the drains $3_0$, $3_1$, $3_2$, the insulating layer 10 and the first and second floating gates 4A, $4B_1$, and $4B_2$ serve as a partial mask (a mask for defining each drain region), whereby self-alignment implantation is achieved, similar to the source 2, with good alignment for the first and second floating gates 4A, $4B_1$, and $4B_2$, without being offset. As the mask M1, an inverted pattern of the source-forming mask M0 may be used; neither masks require extremely fine processing.

After the formation of each drain, program gates $6_1$ and $6_2$ are disposed over the second floating gates $4B_1$ and $4B_2$ to complete the principal fabrication steps for the storage cell.

In the above example, the number of second floating gates is two; however, three or more second floating gates may be provided. In that case, the source region may be further expanded along the direction W in FIG. 9 to increase the drain region along the direction W; in addition, the first floating gate may also be expanded along the direction W to vary the size of the respective second floating gates in the direction W, and arrange them in pair with the program gates. In that case, too, programming can be similarly done for each of the second floating gates as described above. Furthermore, although the reading transistor has been formed at the center of the storage cell, it is not limited thereto, but may be formed in any location as far as it is formed separately from the programming drains and also as far as a reading transistor can be fabricated having a drain that extends adjacent to the first floating gate and the control gate.

Additionally, in the above embodiment, heavily doped layers that are divided according to the programming and reading transistors are assigned to drains, although they may also be assigned to sources; furthermore, heavily doped layers of drains and sources may be divided according to the programming and reading transistors. In such cases where both are divided, stored information could be erased on a bit-by-bit basis.

Furthermore, in the above embodiment, it has been described that the semiconductor substrate 1 is p-type silicon; however, it is not limited thereto, but n-type or other semiconductors may also be used. In addition, the floating gates, control gates and other oxides, as well as the source and drain, may be formed in various shapes with various kinds of materials; thus, the present invention may be altered or modified without departing from the scope of the invention that may be implemented by those skilled in the art.

As described in detail above, with a non-volatile memory having a cell applying to multi-bit data by means of a double layered floating gate architecture, and its programming/erasing method according to the present invention, the second floating gates store carriers corresponding to each data bit, while the first floating gate determines a drain current threshold in accordance with the sum of carriers stored on all the second floating gates, so that two or more bits of data can be saved with a single storage cell. Thus, the semiconductor substrate area on a bit-by-bit basis can be reduced, and thus the number of storage cells required for the memory as a whole can be minimized, thereby increasing the storage capacity of the memory. In addition, with the reading method according to the present invention, because a transistor formed by the first floating gate and control gate is used exclusively for read-out, independently of the program, it is unlikely to be affected by parasitic resistance. Additionally, a so-called "soft program" problem, that is, programming is performed during read-out, is avoided.

Furthermore, because programming with hot carrier injection can be applied to such a non-volatile memory, it can be implemented without sacrificing the programming speed.

There is another advantage that because the second floating gates that store carriers are independent of each other corresponding to input data bits, the memory according to the present invention facilitates carrier storage control in the program mode, as compared to a cell transistor of such a structure that an amount of carrier corresponding to multiple input data bits is stored on a single floating gate in an analog manner.

What is claimed is:

1. A non-volatile memory cell comprising:

heavily doped layers being formed apart from each other along a predetermined arrangement direction in a semiconductor substrate, said heavily doped layers serving as a source and a drain;

a first floating gate disposed along a direction orthogonal to said predetermined arrangement direction between one of said heavily doped layers and the other of said heavily doped layers over a principal plane of said semiconductor substrate;

a plurality of second floating gates which respectively extend across said first floating gate over a principal plane of said first floating gate and lie along said predetermined arrangement direction, close to one of said heavily doped layers;

a plurality of program gates, each being disposed over a principal plane of each of said second floating gates; and a control gate extending across said first floating gate over the principal plane of said first floating gate and being disposed along said predetermined arrangement direction, close to the other of said heavily doped layers.

2. A non-volatile memory according to claim 1, wherein said second floating gates have different areas that face said first floating gate.

3. A non-volatile memory according to claim 1, wherein said second floating gates have different distances with respect to said first floating gate at locations facing said first floating gate.

4. A non-volatile memory according to claim 1, wherein one of said heavily doped layers serves as said drain, whereas the other of said heavily doped layers serves as said source.

5. A non-volatile memory according to claim 1, wherein a transistor section formed by either of said heavily doped layers, said first floating gate, and said control gate is a specific functional transistor section having a function different from a programming function.

6. A non-volatile memory according to claim 1, wherein one of said heavily doped layers is divided into a plurality of regions corresponding to each of said second floating gates and said control gate.

7. A non-volatile memory according to claim 6, wherein said first floating gate extends in a direction orthogonal to a channel formed between one of said heavily doped layers and the other thereof over said semiconductor substrate, and wherein the region corresponding to said control gate is defined adjacent to said first floating gate, and the region corresponding to each of said second floating gates is defined separated from said first floating gate for a predetermined distance.

8. A non-volatile memory according to claim 6, wherein each of said regions is sandwiched between electrically-insulating layers disposed over the principal surface of said semiconductor substrate and in the direction orthogonal to said predetermined arrangement direction.

9. A non-volatile memory according to claim 6, wherein the other of said heavily doped layers is formed in a single region.

10. A method for accessing a multi-bit non-volatile memory cell, comprising the steps of:

providing the multi-bit non-volatile memory cell having a source and a plurality of first drains in a semiconductor substrate, a first floating gate overlying a channel region between the source and the plurality of first drains, a plurality of second floating gates over the first floating gate, each second floating rate being adjacent to a corresponding first drain, and a plurality of program gates over the plurality of second floating gates; and programming the multi-bit non-volatile memory cell by performing at least the steps of applying a programming drain voltage to at least one first drain, applying a programming gate voltage to at least one program gate corresponding to the at least one first drain, and injecting hot carriers generated thereby near one end of the at least one first drain into at least one second floating gate over the at least one first drain through a field developed between the at least one program gate and said semiconductor substrate.

11. The method as claimed in claim 10, further comprising the step of erasing the multi-bit non-volatile memory cell, said step comprising:

applying an erasing drain voltage to the at least one first drain; and pulling the carriers stored in the at least one second floating gate into the at least one first drain.

12. The method as claimed in claim 10, wherein:

the step of providing the multi-bit non-volatile memory cell further includes providing the multi-bit non-volatile memory cell having a second drain in the semiconductor substrate separated from the source and from the plurality of first drains, and a control gate over a portion of the first floating gate overlying a channel region between the source and the second drain; and the method further comprises the step of reading the multi-bit non-volatile memory cell, said step including applying a reading voltage to the control gate and detecting a channel current developed in the semiconductor substrate between the source and the second drain.

* * * * *